United States Patent [19]
Mishra et al.

[11] Patent Number: 5,084,743
[45] Date of Patent: Jan. 28, 1992

[54] HIGH CURRENT, HIGH VOLTAGE BREAKDOWN FIELD EFFECT TRANSISTOR

[75] Inventors: Umesh K. Mishra; Robert J. Trew, both of Cary, N.C.

[73] Assignee: North Carolina State University at Raleigh, Raleigh, N.C.

[21] Appl. No.: 494,239

[22] Filed: Mar. 15, 1990

[51] Int. Cl.$^5$ .................. H01L 29/80; H01L 29/161; H01L 29/34

[52] U.S. Cl. ........................................ 357/22; 357/16; 357/52; 357/61

[58] Field of Search ................. 357/22 A, 22 MD, 16, 357/23.2, 23.15, 52, 61

[56] References Cited

U.S. PATENT DOCUMENTS

| | | | |
|---|---|---|---|
| 4,422,888 | 12/1983 | Stutius | 357/16 |
| 4,450,462 | 5/1984 | Nuyen . | |
| 4,636,824 | 1/1987 | Ikoma et al. | 357/23.2 |
| 4,656,492 | 4/1987 | Sunami et al. . | |
| 4,727,403 | 2/1988 | Hida et al. | 357/22 A |
| 4,831,422 | 5/1989 | Ohno . | |
| 4,839,703 | 6/1989 | Ohata et al. | 357/22 A |
| 4,905,061 | 2/1990 | Ohmuro et al. | 357/22 A |
| 4,987,463 | 1/1991 | Goronkin et al. | 357/22 A |
| 4,992,840 | 2/1991 | Haddad et al. | 357/23.15 |

FOREIGN PATENT DOCUMENTS

| | | | |
|---|---|---|---|
| 186058 | 7/1986 | European Pat. Off. . | |
| 52-34233 | 1/1978 | Japan . | |
| 61-60519 | 9/1987 | Japan . | |
| 63-93161 | 4/1988 | Japan | 357/22 MD |
| 62-19847 | 8/1988 | Japan . | |
| 62-99898 | 11/1988 | Japan . | |
| 62-165444 | 1/1989 | Japan . | |

OTHER PUBLICATIONS

Improvement of the Drain Breakdown Voltage of GaAs Power MESFET's by a Simple Recess Structure, IEEE, vol. ED-25, No. 6, pp. 563-567, Jun. 1978.

The Role of the Device Surface in the High Voltage Behavior of the GaAs MESFET, Solid-State Electronics, vol. 29, No. 8, pp. 807-813, 1986.

Split-Gate Field-Effect Transistor, Appl. Phys. Lett. 54 (2), pp. 162-164, Jan. 9, 1989.

Proceedings IEEE/Cornell Conference on Advanced Concepts in High Speed Semiconductor Devices and Circuits, IEEE Cat. No. 87CH2526-2, pp. 229-238, Aug. 10-12, 1987.

*Primary Examiner*—Andrew J. James
*Assistant Examiner*—Ngan Van Ngo
*Attorney, Agent, or Firm*—Bell, Seltzer, Park & Gibson

[57] ABSTRACT

The gate voltage breakdown of an integrated circuit field effect transistor, especially a compound semiconductor metal semiconductor field effect transistor (MESFET) and high electron mobility transistor (HEMT) is dramatically increased by forming an electron trap layer on the surface of the device, under the gate contact and extending beyond the gate contact towards the drain contact. The electron trap layer is preferably a high resisitivity lattice matched monocrystalline layer having at least $10^{18}$ traps per cubic centimeter. For gallium arsenide based transistors, the electron trap layer is preferably formed by low temperature molecular beam epitaxy (MBE) of gallium and arsenic fluxes, to produce a monocrystalline gallium arsenide layer having 1% excess arsenic. For indium phosphide based transistors, the electron trap layer is preferably formed by low temperature MBE of aluminum, indium and arsenic fluxes to produce a monocrystalline aluminum indium arsenide layer having 1% excess arsenic.

43 Claims, 5 Drawing Sheets

HIGH CURRENT, HIGH VOLTAGE BREAKDOWN FIELD EFFECT TRANSISTOR

FIELD OF THE INVENTION

This invention relates to integrated circuit devices and more particularly to a high current integrated circuit field effect transistor having a high breakdown voltage.

BACKGROUND OF THE INVENTION

Field Effect Transistor (FET) devices are widely used in microelectronic fabrication of Very Large Scale Integrated (VLSI) and Ultra Large Scale Integrated (ULSI) devices, and in microwave and other radio frequency devices. FET's have long been implemented using silicon semiconductor technology in the form of Metal Oxide Semiconductor Field Effect Transistors (MOSFET), also referred to as Metal Insulator Field Effect Transistors (MISFET) or Insulated Gate Field Effect Transistors (IGFET). There has also been some activity in implementing FETs in germanium and other single element semiconductors.

Recently much interest has developed in compound semiconductor materials such as gallium arsenide (GaAs) and indium phosphide (InP). Such compound semiconductors have been widely investigated for VLSI and ULSI devices, for high frequency (millimeter or microwave) devices and for lasers. Compound semiconductor materials have a higher electron mobility and electron velocity than single element semiconductors, as well as a higher insensitivity to radiation.

As is well known to those having skill in the art a FET comprises source and drain regions formed in one face of a semiconductor substrate and a channel formed in the semiconductor substrate between the source and drain regions. Source, drain and gate contacts are provided for the source, drain and channel respectively. In compound semiconductor FET devices an insulator, often in the form of an oxide, may be included between the channel and the gate contact to mimic the MISFET structure of single element semiconductor devices. See for example Japanese published patent application 61-60519 to Sakamoto, published Sept. 26, 1987 which discloses a gallium arsenide MISFET having a large threshold voltage, and including a gate electrode on a semi-insulating gallium arsenide film which overlies the channel, in which the gallium arsenide semi-insulating film may be formed by molecular beam epitaxy or molecular chemical vapor deposition. See also U.S. Pat. No. 4,450,462 to Nuyen which discloses a MISFET formed in gallium arsenide.

Much investigation has also been directed to unique FET structures for compound semiconductor devices. In particular, a class of devices often called MEtal Semiconductor Field Effect Transistors (MESFET) includes a gate contact which lies directly on the channel, without an intervening oxide or insulating layer. MESFETs operate under principles of geometry control with the gate voltage controlling the channel geometry. Efforts have also been made to improve the performance of compound semiconductor FETs by providing heterostructures within the devices to form a High Electron Mobility (HEMT) field effect transistor, also referred to as a MOdulation Doped FET (MODFET). In the HEMT, a two-dimensional electron gas is created in the heterostructure, with charge control mechanisms operating to control the electron gas.

Voltage breakdown has long been a limiting factor in FET devices. Breakdown is the well known phenomena in which application of a voltage greater than the breakdown voltage causes avalanche multiplication of carriers in the device. Gate breakdown has been experienced in silicon-based FET technology, wherein logic voltages of five volts or more must be withstood by the gate. However, the presence of an oxide or insulator region between the gate electrode and the channel tends to increase gate breakdown, and an oxide between the gate and drain tends to increase the transconductance and adversely effect device performance.

Gate breakdown has been the most limiting factor in compound semiconductor FETs, and in particular in MESFETs and HEMTs wherein a gate insulator is not used. In particular, the major drawback of the MESFET/HEMT in microwave applications has been its efficiency as a high power source. The limit to both its output power and efficiency is the breakdown voltage of the gate. This problem is very important at "C" and "X" band frequencies and becomes crucial at millimeter wave frequencies. Often, breakdown voltages of less than five volts under open channel current conditions are observed, thereby greatly decreasing the usefulness of these devices. To compensate for this breakdown, multiple devices must often be used instead of a single device in order to allow high power output without breakdown.

Since gate breakdown is the limiting factor in compound semiconductor MESFETs and HEMTs, many attempts have been made to produce these FETs with high gate breakdown voltage. For example, many techniques have attempted to increase the breakdown voltage of the FET by limiting the current which can be handled thereby. Unfortunately this current versus voltage tradeoff does not increase the overall power which can be handled by the FET. One example of this technique may be found in published European patent application 186,058, published July 19, 1986, which describes a lightly doped drain (LDD) FET in which the drain side of the channel has a lighter doping concentration than the source side of the channel. Another example of this technique is shown in U.S. Pat. No. 4,656,492 to Sunami et al., in which the doping distribution in the channel is gently sloped, to limit the channel current and avoid breakdown.

Other techniques for increasing the breakdown voltage of MESFETs and HEMTs require physical shaping of the channel to prevent breakdown. Unfortunately, these techniques also involve a tradeoff between current capacity and voltage breakdown so that greater overall power handling ability does not result. Moreover, channel shaping requires complex processing steps. See for example published Japanese patent application 62-19897 to Saito, published on Aug. 3, 1988, which discloses a high breakdown voltage gallium arsenide FET having an active layer which is thicker between the gate and source than between the gate and drain. A similar physical shaping technique is disclosed in an article entitled "Improvement of the Drain Breakdown Voltage of GaAs Power MESFETs By A Simple Recess Structure" published in the IEEE Transactions on Electron Devices, Volume ED-25 No. 6, June 1978, pages 563-567 to Furutsuka et al. Disclosed is a recess structure which improves breakdown voltage by increasing the thickness of the active epitaxial layer at the drain contact region.

Other techniques have been employed to prevent electrons from being captured by the gate electrode during breakdown. See for example Japanese published patent application 62-99898 to Kimura, published Nov. 2, 1988. Disclosed is a MISFET having a polysilicon layer within the gate insulating layer. This polysilicon layer captures electrons or holes produced. However this layer will not prevent breakdown between the gate and drain or the gate and source; it merely prevents electrons from being captured in the gate contact during breakdown.

A theoretical study of the breakdown physics of a gallium arsenide MESFET was published in Solid State Electronics, Volume 29, No. 8, pages 807-813, 1986 under the title "The Role of the Device Surface in the High Voltage Behavior of the GaAs MESFET", by Barton et al. Barton et al. discloses that surface effects can have a large impact in determining GaAs MESFET characteristics at high voltages. In particular, it was shown in this study that the large electric field that forms at the drain end of the gate in a MESFET, and that is primarily responsible for breakdown occurring at the gate edge, is caused by excess surface charge. Although this theoretical study investigated breakdown models for FETs, no techniques were disclosed to increase breakdown voltage of the FET.

SUMMARY OF THE INVENTION

It is therefore an object of the invention to provide an improved Field Effect Transistor (FET) device.

It is another object of the invention to provide an FET device having a high breakdown voltage.

It is yet another object of the invention to provide a FET having high breakdown voltage at high current levels.

It is still another object of the invention to provide a compound semiconductor FET which is highly resistant to breakdown voltage at high current levels.

It is a further object of the invention to provide a high current compound semiconductor MEtal Semiconductor FET (MESFET) and High Electron Mobility Transistor (HEMT) which are highly resistant to voltage breakdown.

These and other objects are provided according to the present invention by an integrated circuit FET which includes an electron trap layer formed on the face of the semiconductor surface between at least part of the gate contact and the channel, and which extends beyond the gate contact towards the drain contact. This electron trap layer traps electrons which flow on the face of the semiconductor substrate between the gate and drain contacts. In other words, the electron trap layer is a high resistivity layer which acts as a "sponge" to absorb surface currents which are the primary cause of gate voltage breakdown in the FET. In a preferred embodiment, the electron trap layer is coextensive with the gate electrode and extends beyond the gate electrode to the drain. It may also extend beyond the gate electrode to the source. It may also fully extend to the source and drain contacts and may even extend under the contacts. The electron trap layer includes at least $10^{18}$ traps per cubic centimeter, which is orders of magnitude larger than a conventionally doped semiconductor, and preferably includes between $10^{18}$ and $10^{22}$ electron traps per cubic centimeter. The electron trap layer is not an insulator which prevents any current from flowing therein, nor is it a conductor which allows current to freely flow without trapping electrons.

The electron trap layer of the present invention may be formed in a compound semiconductor MESFET or HEMT by providing a surface layer of gallium arsenide or aluminum indium arsenide having excess arsenic. Preferably the gallium arsenide or aluminum indium arsenide layers have about 1% excess arsenic and are preferably formed by low temperature molecular beam epitaxy of gallium and arsenic or indium, aluminum, and arsenic, respectively. The gallium arsenide electron trap layer is preferably used in a gallium arsenide based MESFET or HEMT while the aluminum indium arsenide layer is preferably used in an indium phosphide based MESFET or HEMT.

The excess arsenic gallium arsenide and excess arsenic aluminum indium arsenide are preferably formed using low temperature molecular beam epitaxy (MBE) according to a technique described in a publication entitled "New MBE Buffer for Micron and Quarter Micron GaAs MESFETs" by Smith et al., published in the "Proceedings of the IEEE/Cornell Conference on Advanced Concepts in High Speed Semiconductor Devices and Circuits", pages 229-238, Aug. 10-12, 1987, the disclosure of which is incorporated herein by reference. In the Smith et al. publication it was shown that low temperature molecular beam epitaxy of gallium arsenide may be provided using gallium and arsenic beam fluxes at substrate temperatures between 100°-300° C. The monocrystalline gallium arsenide formed thereby differs markedly from GaAs grown at normal growth temperatures of approximately 600° C. Although the gallium arsenide layer so grown is monocrystalline and optically inactive, the low temperature gallium arsenide has about 1% excess arsenic. This excess arsenic produces a severe perturbation to the band structure of the gallium arsenide compared to a doped gallium arsenide crystal and provides large numbers of electron traps in the gallium arsenide. In the Smith et al. publication, the low temperature MBE GaAs is used as a buffer layer between the active device region and the bulk of the semiconductor substrate to reduce the "back-gating" phenomena resulting from substrate bias voltage. There is no suggestion to use this material as a surface electron trap layer.

According to the present invention, the surface electron trap layer between the gate and drain dramatically increases the breakdown voltage of the FET. Since the electron trap layer is preferably an epitaxially formed monocrystalline layer on the channel, the device characteristics themselves, including the current handling capacity of the device, are not changed. Stress is also not introduced on the device surface because of the lattice match. However, for identical device geometries, it has been found that the electron trap layer can increase the gate breakdown voltage more than fivefold, for example from 5 to 25 volts. Accordingly, in radio frequency applications, devices may be designed with significantly enhanced radio frequency output power. Fewer devices will be required for a given power output, resulting in simplified circuit and system designs at significantly reduced costs. Digital logic circuits may also be built to operate with higher power supply voltages and a resulting increase in speed.

DESCRIPTION OF THE PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout. For ease of illustration the thickness of layers has been exaggerated.

Figure 1:
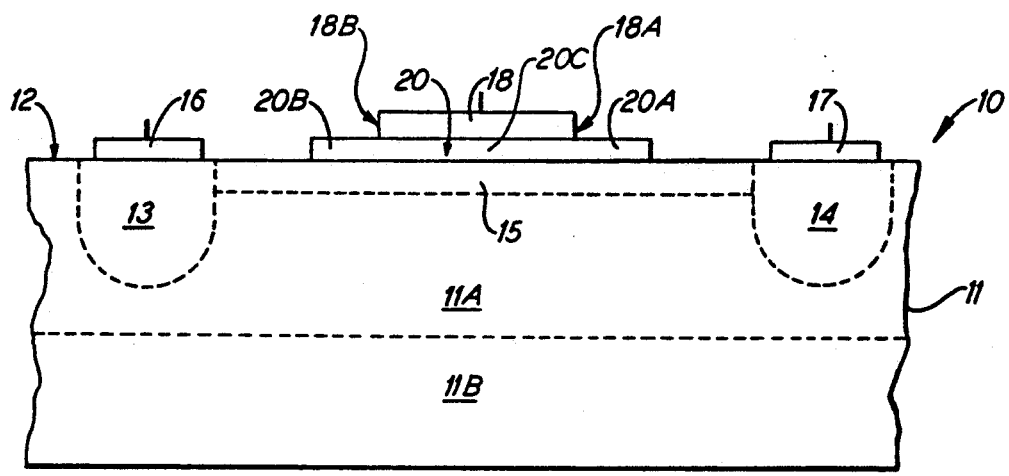
FIG. 1 illustrates a cross sectional view of compound semiconductor metal semiconductor field effect transistor (MESFET) according to the present invention.

Referring now to FIG. 1, a compound semiconductor MESFET incorporating the electron trap surface layer of the present invention will now be described. MESFET 10 is formed at one face 12 of a semiconductor substrate 11. In a gallium arsenide (GaAs) based MESFET, substrate 11 typically comprises monocrystalline gallium arsenide having an undoped region 11B and an active device region 11A which may be doped n or p type. It will be understood by those having skill in the art that gallium arsenide substrate 11 may itself be formed on a silicon or other substrate. Source region 13, drain region 14 and channel region 15 are formed at one face 12 of the substrate 11 using processes which are well known to those having skill in the art and which need not be described further herein. Associated with source, drain and channel regions 15 are ohmic source, drain and gate contacts 16, 17, and 18, respectively. These contacts may be formed of metal, metal alloys or other materials well known to those having skill in the art.

According to the present invention, a large increase in breakdown voltage is provided by forming an electron trap layer 20 between the gate contact 18 and channel 15, which extends beyond the drain end 18A of the gate contact 18, towards the drain contact 17, as shown at 20A. The electron trap layer may also extend beyond the source end 18B of the gate contact 18 towards the source contact 16 as shown at 20B. It will be understood by those having skill in the art that the electron trap filled layer 20 need not be coextensive with gate contact 18. Moreover, region 20A may extend all the way to drain contact 17 and region 20B may extend all the way to source contact 16. In fact, regions 20A and 20B may extend under drain and source contacts 17 and 16 respectively.

According to the invention, electron trap layer 20 preferably is a monocrystalline semiconductor material which is lattice matched to the channel region 15 and epitaxially formed thereon. However, in contrast with a conventionally doped semiconductor layer which may have up to $10^{16}$ electron traps per cubic centimeter, electron trap layer 20 has severe perturbations to the crystalline structure, with $10^{18}$–$10^{22}$ electron traps per cubic centimeter. Preferably electron trap layer 20 has $10^{20}$ traps per cubic centimeter, because too few traps will not trap enough electrons to significantly increase the breakdown voltage while too many traps will severely perturb the monocrystalline structure of the layer and will thereby impact device performance. In particular, it has been found that low temperature molecular beam epitaxial deposition of gallium arsenide or aluminum indium arsenide results in 1% excess arsenic, and provides the desired number of traps. A conventional insulator such as silicon dioxide ($SiO_2$) or silicon nitride ($Si_3N_4$) cannot be used because an insulator does not supply the required electron traps to block current flow. Moreover, a conventional insulator creates stress on the semiconductor surface due to piezoelectric effects, thereby introducing a depletion region which degrades device performance. A conductor also cannot be used because current flows therethrough without significant trapping.

Figure 2:
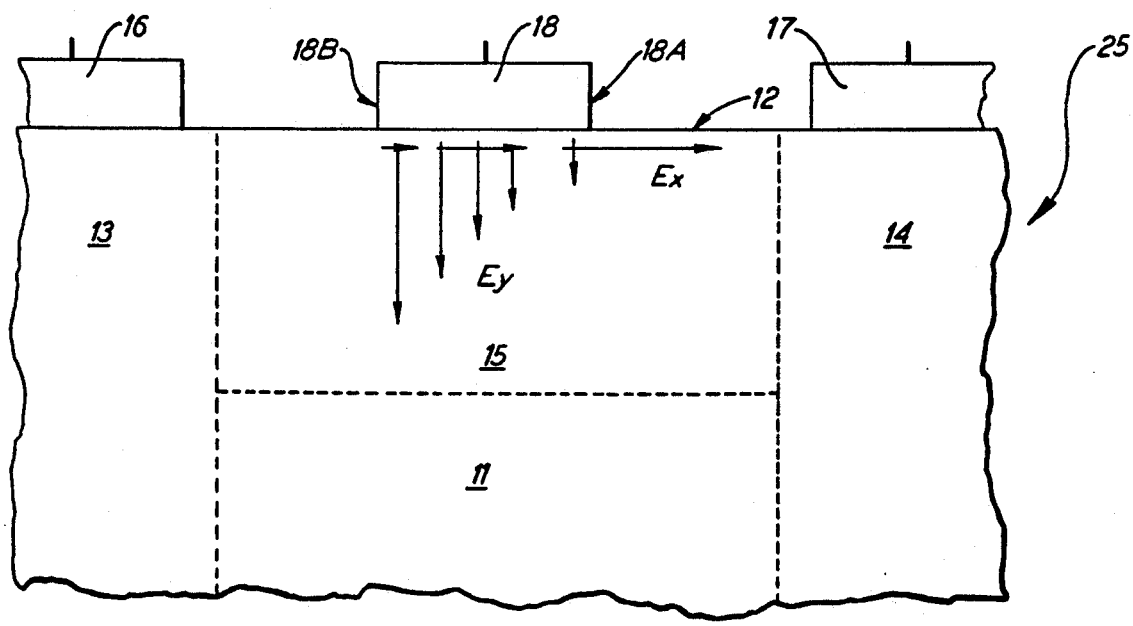
FIG. 2 illustrates a cross sectional view of the electric fields present under the gate contact of a MESFET.

Referring now to FIG. 2, the physics of gate-drain surface breakdown in a conventional MESFET will now be described. For ease of illustration a magnified view of the device near channel 15 is shown. It may be seen that under normal biasing conditions, the electric field within the MESFET 25 is inherently two-dimensional. Near the source edge 18B of the gate 18 the gate, the electric field is dominantly directed towards the channel in the vertical direction, shown as Ey, with the electric lines of force emanating from the positive charges in the depletion region and terminating on the negative charges on the gate electrode. However, towards the drain edge 18A of the gate 18, the electric field slowly rotates towards the drain 14 in the horizontal direction, shown as Ex, where the Y component of the field forms the depletion region and the X component of the field is caused by image charges on the gate and the drain.

It has been found that the field Ex injects charges into the surface states near the drain end 18A of the gate electrode 18. The injection mechanism is believed to be the result of thermally assisted tunnel breakdown at the gate, which results from the high magnitude of the horizontal electric field and the heating caused by the high drain current at saturation current levels. Accordingly, electrons tunnel from the metal gate contact 18 to the face 12 of the substrate and accumulate on the face next to the gate due to "relaxation semiconductor" conditions (dielectric relaxation time is greater than recombination or trapping time). Large surface currents result, leading to surface breakdown between the gate and the drain. It has also been found that the gate-drain surface breakdown described above is the major cause of breakdown at low voltage in a MESFET. Other breakdown phenomena, such as bulk-gate breakdown, bulk-drain breakdown and channel/substrate breakdown occur at much higher voltages because they are bulk phenomena. Accordingly, the present invention eliminates the surface breakdown described in FIG. 2 so that device breakdown occurs at a much higher voltage at which one of the three bulk breakdown mechanisms noted above takes place.

Figure 3:
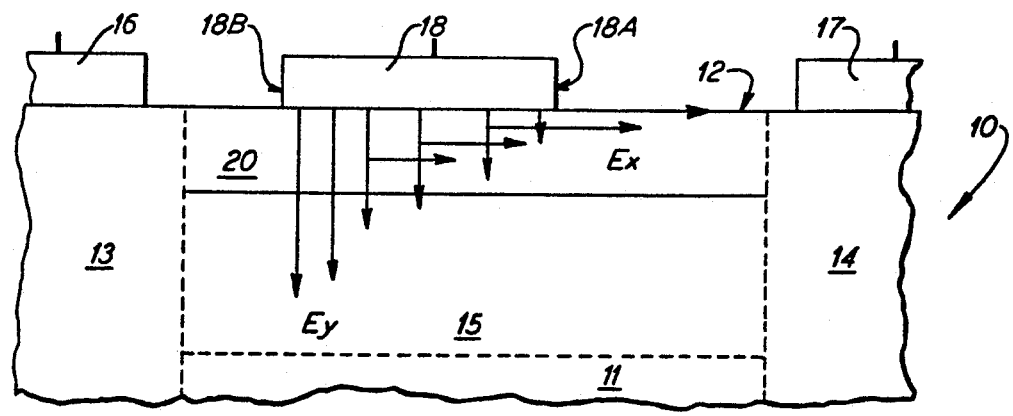
FIG. 3 illustrates a cross sectional view of the electric fields present under the gate contact of a MESFET according to the present invention.

Referring now to FIG. 3, the breakdown physics of the MESFET having the electron trap layer 20 of the present invention will now be described. As shown in FIG. 3, if the surface semiconductor is replaced by a material which is lattice matched to the channel 15 and has a substantially larger critical field for breakdown, coupled with poor surface conductivity (high resistivity), then the breakdown voltage of the FET is increased. In particular, the surface material must have a large number of electron traps to hinder the flow of surface currents that leak from the gate electrode. Since the surface is thin and is lattice matched to the channel 15, the electric field in the channel, Ey, is not impacted. Device operation is therefore not impacted. However, the current flowing as a result of field Ex is substantially trapped within layer 20 so that gate-drain breakdown is prevented.

The preferred material for electron trap layer 20 in a gallium arsenide (GaAs) based MESFET or HEMT is low temperature MBE GaAs whereas the preferred material for indium phosphide (InP) based MESFETs or HEMTs is low temperature MBE aluminum indium arsenide (AlInAs). Low temperature MBE is described in the aforementioned Smith et al. publication and need not be described in detail herein. Briefly, a GaAs layer may be grown using Ga and As beam fluxes, under arsenic-stable growth conditions, at substrate temperatures between 100° C. and 300° C. and at growth rates of 1μm/hour.

The formation of a GaAs MESFET and an InP HEMT according to the present invention will now be described. It will be understood by those having skill in the art that source, drain and channel regions 13, 14, and 15 may be formed in semiconductor substrate 11 using conventional FET fabrication processes. The electron trap layer may be formed using low temperature MBE, as described above. Drain, source and gate contacts may be formed using conventional contact forming techniques, with the gate contact being formed on an interior position 20C of the electron trap layer so that the electron trap layer extends beyond the gate contact towards the drain. It may also extend towards the source.

EXAMPLE 1—GaAs MESFET

A GaAs MESFET was fabricated by forming a 20nm thick low temperature GaAs layer on a 12.5nm n doped GaAs substrate having doping concentration of $4 \times 10^{18}$ dopants per cubic centimeter. The n doped GaAs substrate may itself be formed on a GaAs buffer layer formed on a silicon substrate. Conventional devices having a 12.5nm doped substrate region and a 1μm gate length exhibit gate-drain breakdown voltage of 8-10 volts.

A gallium arsenide electron trap layer, 20nm thick, was grown by MBE at a growth temperature of 200° C. and extended from under the source contact to under the drain contact as shown in FIG. 3.

Figure 4A:
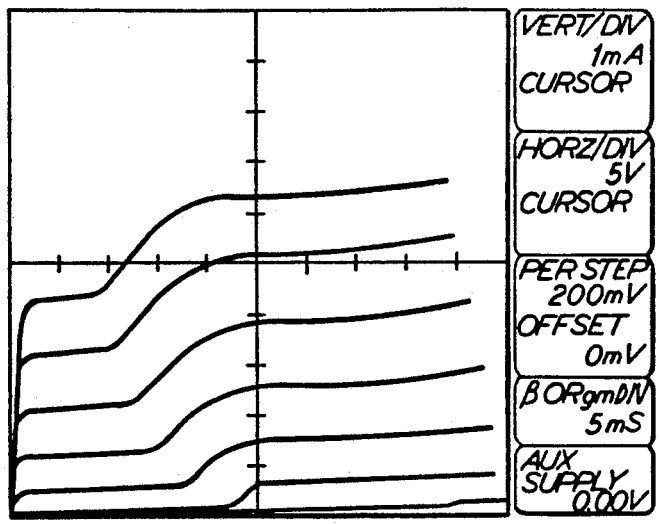
FIG. 4A-4C illustrates the electrical characteristics of the MESFET of FIG. 1.
Figure 4B:
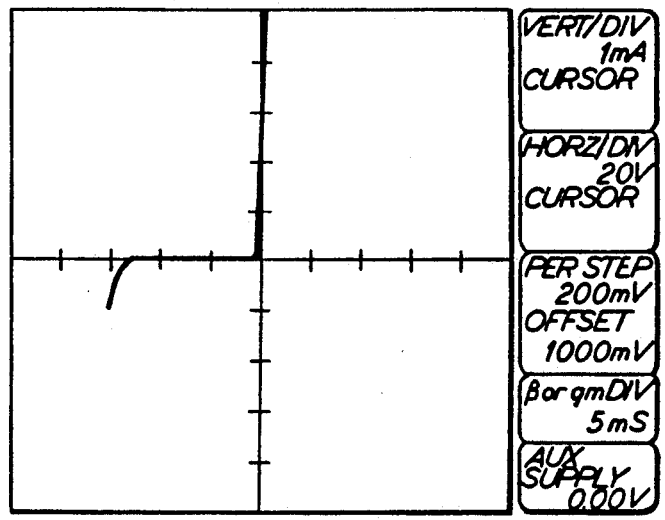
Figure 4C:
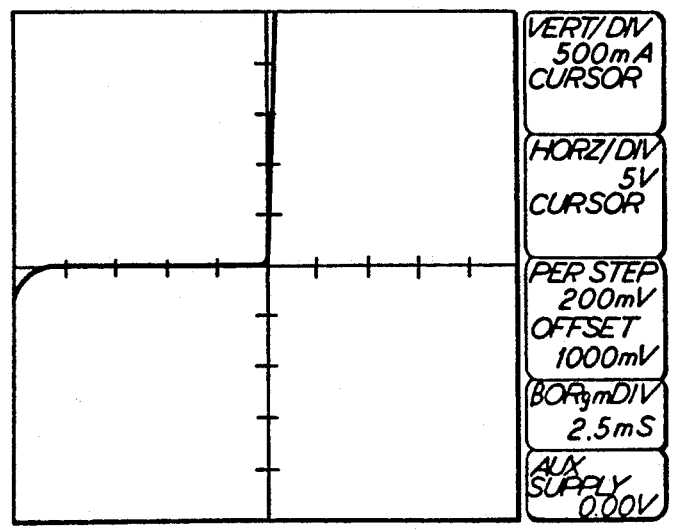

FIG. 4 illustrates the characteristics of this device. FIG. 4A shows the current-voltage characteristics of the device. FIG. 4B illustrates a gate-drain breakdown voltage of 60 volts and FIG. 4C illustrates a gate-source breakdown voltage of 25 volts. The difference between the two breakdown voltages is related to the difference in the electrode spacings; 0.5μm between the source and gate and 2.5μm between the drain and the gate. The total spacing between the source and the drain was 4μm. The breakdown voltage of the device is extremely high, demonstrating the advantage gained by incorporation of the low temperature MBE layer of the invention. Indeed, breakdown voltage increased by a factor of at least 6.

In conducting the above experiment it was found that annealing the low temperature MBE gallium arsenide layer, for example at 580° C. for ten minutes, stabilized the layer. It was also found that the sheet resistance of the channel region 15 increased With increasing time and temperature after the electron trap layer 20 of the present invention was used, compared to a conventional MESFET. It is theorized that excess arsenic from the nonstoichiometric low temperature MBE GaAs layer 20 may diffuse into the channel, causing a large increase in channel defects. These defects may act as trap centers in the channel, reducing the carrier concentration and thus increasing the sheet resistance. There may also be enhanced trapping in the low temperature GaAs at high temperatures, which would lead to carrier depletion in the channel, corresponding to the number of carriers trapped. These trapped carriers might also be freed at high drain electric fields, resulting in the "kink" effect shown in FIG. 4A.

Figure 5:
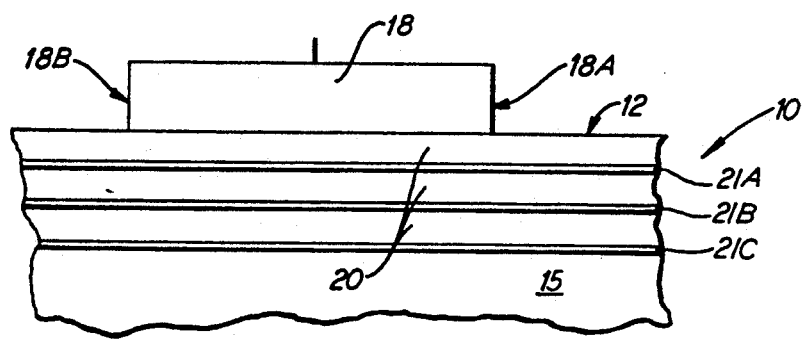
FIG. 5 illustrates a MESFET according to the present invention, incorporating a diffusion barrier layer.

Referring to FIG. 5, the diffusion of arsenic may be eliminated by using one or more thin layers 21A-21C of aluminum, sandwiched between thin layers 20 of low temperature MBE gallium arsenide, to act as diffusion barriers to the excess arsenic. When a single barrier layer is used, it may be located between the low temperature MBE layer 20 and the channel 15 as shown by layer 21C. This diffusion barrier mechanism is based upon the high reactivity of aluminum with arsenic at room temperature or above. It can be determined that for a 5nm low temperature MBE GaAs layer which has 1% excess arsenic, 0.03nm of aluminum is necessary to consume the back-diffusing arsenic, assuming uniform coverage of aluminum. Since 0.03nm is less than a monolayer, an aluminum thickness of 0.5nm may be employed. It is assumed that any unreacted aluminum will be less than a monolayer thick and therefore will not contribute to the device leakage current. Thin layers of aluminum arsenide (AlAs) may also be used as barrier layers.

The carrier capture effect noted above may be eliminated by providing traps at the interface of the low temperature GaAs layer 20 and the channel 15. A sheet of donor charge may be provided, with an areal concentration equal to the interface trap density. For example, a planar doped silicon layer may be provided to supply the traps in the low temperature GaAs layer, leaving the channel unperturbed.

EXAMPLE 2—InP HEMT

Figure 6:
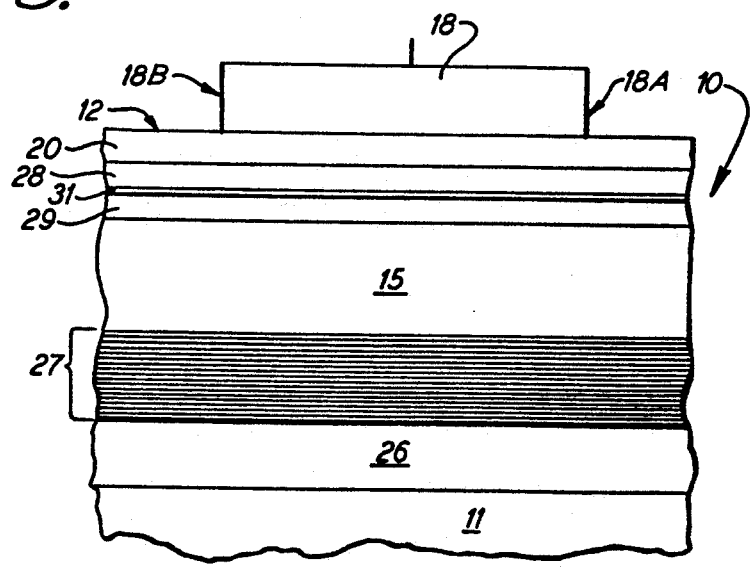
FIG. 6 illustrates a high electron mobility transistor (HEMT) according to the present invention.

Referring now to FIG. 6, an indium phosphide (InP) based High Electron Mobility Transistor (HEMT) incorporating a low temperature MBE AlInAs electron trap layer according to the present invention will now be described. FIG. 6 illustrates a crOss section of a HEMT structure 10 incorporating the barrier layer of the present invention. As shown in FIG. 6, the HEMT 10 includes an InP substrate 11 having an AlInAs buffer 26 thereon. The AlInAs buffer 26 is typically formed using high temperature (such as 500° C.) MBE to provide an equal amount of Al, In and As. An AlInAs-GaInAs superlattice 27 may be formed on the buffer layer 26. A channel 15 of narrow bandgap material, comprising for example 40nm of GaInAs may be formed on the superlattice. Narrow bandgap AlInAs spacers 28 and 29 of thickness of 5nm and 3nm respectively, and having an Si doping layer 31 therebetween is formed on the channel 15, to form a wide and narrow bandgap heterostructure.

According to the invention, an AlInAs barrier layer 20, 20nm thick was grown by low temperature MBE at about 100° C. An undoped GaInAs contact layer 18 may be formed on electron trap layer 20 It will be understood by those having skill in the art that FIG. 6 represents a conventional AlInAs-GaInAs HEMT structure except that the conventional undoped AlInAs barrier layer is replaced by the electron trap layer 20 of the present invention which is grown using low temperature MBE.

Figure 7:
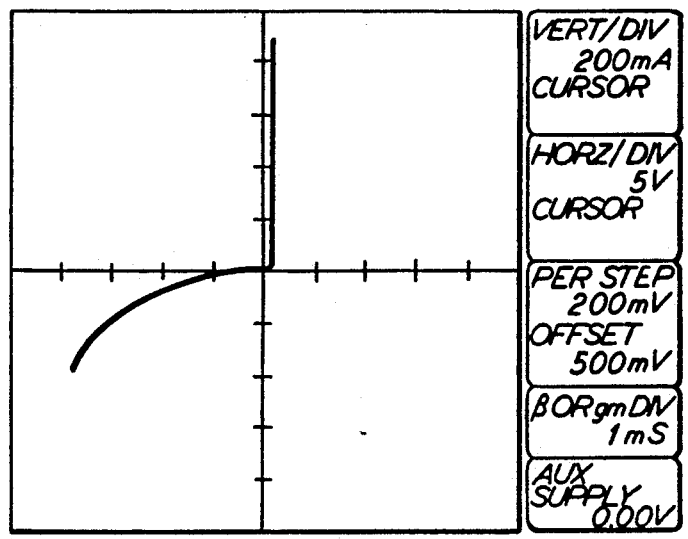
FIG. 7 and 8 illustrate the electrical characteristics of the HEMT of FIG. 6.

Devices with one micron and 0.3 micron gate length were fabricated using a mesa isolated, gate recess process well known to those having skill in the art. The performance of the HEMT with a one micron gate length is shown in FIG. 7. The $g_m$ of the device is 420mS/mm with a drain current of 300mA/mm at a gate bias of 0.5v. As shown in FIG. 7, this high performance is coupled with a gate drain breakdown voltage of 23 volts. This is an exceedingly high breakdown voltage for this HEMT which typically exhibits a breakdown voltage of less than 10 volts for devices with comparable performance. The breakdown voltage of the devices with 0.3 micron gate length was also found to be 8-12 volts which is also substantially larger than that of conventional devices with comparable DC and radio frequency performance.

Figure 8:
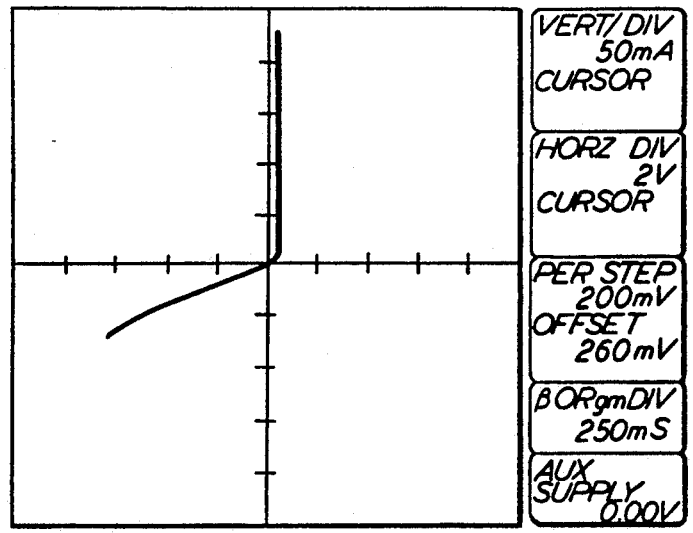
Figure 9:
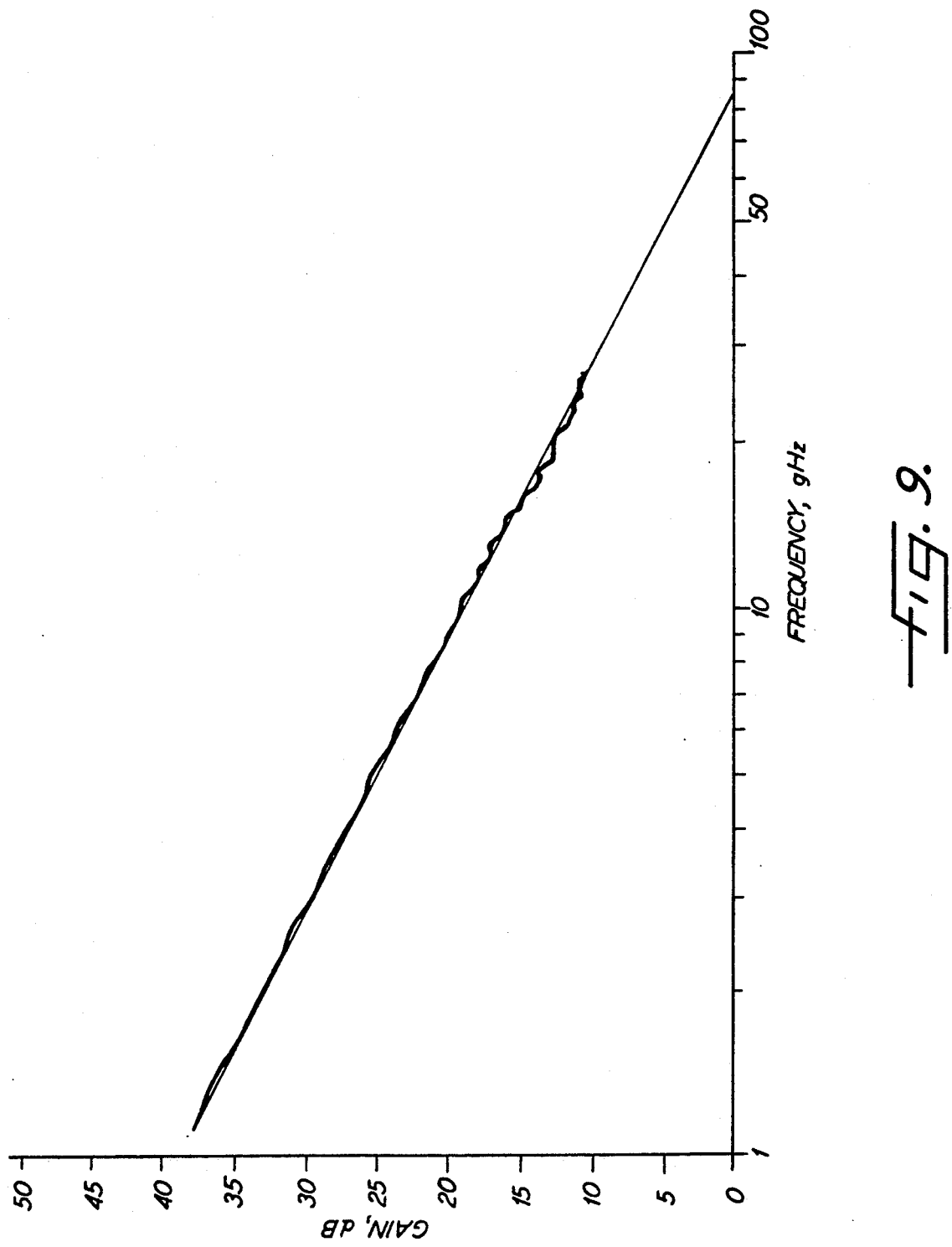
FIG. 9 illustrates the high frequency performance characteristics of the HEMT of FIG. 6.

The breakdown voltage of a submicron device is shown in FIG. 8. The $g_m$ of the device was 680 mS/mm with a drain current larger than 400 mA/mm. The high frequency performance characteristics of the HEMT of Example 2 were obtained by extrapolating the gain versus frequency of the device extracted from the measured S parameters at 6dB/octave as shown in FIG. 9. The zero gain value ($f_t$) of 87 gHz is comparable with the performance of conventional HEMTs. FIGS. 7-9 demonstrate that substantial improvements in the breakdown voltage of indium phosphide based HEMTs can be achieved without sacrificing performance, according to the present invention.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An integrated circuit compound semiconductor metal semiconductor field effect transistor (MESFET) comprising:
   a compound semiconductor substrate;
   source and drain regions formed in said compound semiconductor substrate at one face thereof;
   a channel, formed in said compound semiconductor substrate at said one face, between said source and said drain regions;
   source, drain and gate contacts for contacting said source, drain and channel, respectively; and
   a monocrystalline electron trap layer epitaxially formed on said one face between at least part of said gate contact and said channel, and extending beyond said gate contact towards said drain contact, having at least $10^{18}$ electron traps per cubic centimeter for trapping electrons which flow on said face of said compound semiconductor substrate between said gate and drain contacts;
   whereby said MESFET is resistant to voltage breakdown.

2. The MESFET of claim 1 wherein said electron trap layer further extends beyond said gate contact towards said source contact, for trapping electrons which flow on said face of said semiconductor substrate between said gate and source contacts.

3. The MESFET of claim 1 wherein said electron trap layer extends from said gate contact to said drain contact.

4. The MESFET of claim 1 wherein said electron trap layer further extends beyond said gate contact to said source contact.

5. The MESFET of claim 1 wherein said electron trap layer comprises between $10^{18}$ and $10^{22}$ electron traps per cubic centimeter.

6. The MESFET of claim 1 wherein said compound semiconductor substrate comprises monocrystalline gallium arsenide and wherein said electron trap layer comprises a layer of gallium arsenide having excess arsenic.

7. The MESFET of claim 6 wherein said gallium arsenide layer comprises 1% excess arsenic.

8. The MESFET of claim 6 further comprising a barrier layer between said electron trap layer and said substrate, for preventing diffusion of the excess arsenic into said substrate.

9. The MESFET of claim 8 wherein said barrier layer comprises aluminum or aluminum arsenide.

10. The MESFET of claim 1 wherein said compound semiconductor substrate comprises monocrystalline indium phosphide and wherein said electron trap layer comprises a layer of aluminum indium arsenide having excess arsenic.

11. The MESFET of claim 10 wherein said aluminum indium arsenide comprises 1% excess arsenic.

12. The MESFET of claim 10 further comprising a barrier layer between said electron trap layer and said substrate, for preventing diffusion of the excess arsenic into said substrate.

13. The MESFET of claim 12 wherein said barrier layer comprises aluminum or aluminum arsenide.

14. An integrated circuit compound semiconductor high electron mobility transistor (HEMT) comprising:
   a compound semiconductor substrate;
   source and drain regions formed in said compound semiconductor substrate at one face thereof;
   a wide and narrow bandgap heterostructure, formed in said compound semiconductor substrate at said one face, between said source and said drain regions;
   source, drain and gate contacts for contacting said source, drain and heterostructure, respectively; and
   a monocrystalline electron trap layer epitaxially formed on said one face between at least part of said gate contact and said heterostructure, and extending beyond said gate contact towards said drain contact, having at least $10^{18}$ electron traps per cubic centimeter for trapping electrons which flow on said face of said compound semiconductor substrate between said gate and drain contacts;
   whereby said HEMT is resistant to voltage breakdown.

15. The HEMT of claim 14 wherein said electron trap layer further extends beyond said gate contact towards said source contact, for trapping electrons which flow on said face of said semiconductor substrate between said gate and source contacts.

16. The HEMT of claim 14 wherein said electron trap layer extends from said gate contact to said drain contact.

17. The HEMT of claim 14 wherein said electron trap layer further extends beyond said gate contact to said source contact.

18. The HEMT of claim 14 wherein said electron trap layer comprises between $10^{18}$ and $10^{22}$ electron traps per cubic centimeter.

19. The HEMT of claim 14 wherein said compound semiconductor substrate comprises monocrystalline gallium arsenide and wherein said electron trap layer comprises a layer of gallium arsenide having excess arsenic.

20. The HEMT of claim 19 wherein said gallium arsenide layer comprises 1% excess arsenic.

21. The HEMT of claim 19 further comprising a barrier layer between said electron trap layer and said substrate, for preventing diffusion of the excess arsenic into said substrate.

22. The HEMT of claim 21 wherein said barrier layer comprises aluminum or aluminum arsenide.

23. The HEMT of claim 14 wherein said compound semiconductor substrate comprises monocrystalline indium phosphide and wherein said electron trap layer comprises a layer of aluminum indium arsenide having excess arsenic.

24. The HEMT of claim 23 wherein said aluminum indium arsenide comprises 1% excess arsenic.

25. The HEMT of claim 23 further comprising a barrier layer between said electron trap layer and said substrate, for preventing diffusion of the excess arsenic into said substrate.

26. The HEMT of claim 25 wherein said barrier layer comprises aluminum or aluminum arsenide.

27. An integrated circuit field effect transistor comprising:
   a semiconductor substrate;
   source and drain regions formed in said semiconductor substrate at one face thereof;
   a channel, formed in said semiconductor substrate at said one face, between said source and said drain region;
   source, drain and gate contacts for contacting said source, drain and channel, respectively; and
   a monocrystalline electron trap layer formed on said one face between at least part of said gate contact and said channel, and extending beyond said gate contact towards said drain contact, and having at least $10^{18}$ electron traps per cubic centimeter for trapping electrons which flow on said face of said semiconductor substrate between said gate and drain contacts;
   whereby said integrated circuit field effect transistor is resistant to voltage breakdown.

28. The transistor of claim 27 wherein said electron trap layer further extends beyond said gate contact towards said source contact, for trapping electrons which flow on said face of said semiconductor substrate between said gate and source contacts.

29. The transistor of claim 27 wherein said electron trap layer extends from said gate contact to said drain contact.

30. The transistor of claim 27 wherein said electron trap layer further extends beyond said gate contact to said source contact.

31. The transistor of claim 27 wherein said electron trap layer comprises between $10^{18}$ and $10^{22}$ electron traps per cubic centimeter.

32. The transistor of claim 27 wherein said electron trap layer comprises a layer of gallium arsenide having excess arsenic.

33. The transistor of claim 27 wherein said gallium arsenide layer comprises 1% excess arsenic.

34. The transistor of claim 32 wherein said substrate comprises monocrystalline gallium arsenide and wherein said electron trap layer comprises a layer of monocrystalline gallium arsenide having excess arsenic.

35. The transistor of claim 32 further comprising a barrier layer between said electron trap layer and said substrate, for preventing diffusion of the excess arsenic into said substrate.

36. The transistor of claim 35 wherein said barrier layer comprises aluminum or aluminum arsenide.

37. The transistor of claim 27 wherein said transistor comprises a metal semiconductor field effect transistor (MESFET).

38. The transistor of claim 27 wherein said transistor comprises a high electron mobility transistor (HEMT).

39. The transistor of claim 27 wherein said electron trap layer comprises a layer of aluminum indium arsenide having excess arsenic.

40. The transistor of claim 39 wherein said aluminum indium arsenide comprises 1% excess arsenic.

41. The transistor of claim 39 wherein said substrate comprises monocrystalline indium phosphide and wherein said electron trap layer comprises a layer of monocrystalline aluminum indium arsenide having excess arsenic.

42. The transistor of claim 39 further comprising a barrier layer between said electron trap layer and said substrate, for preventing diffusion of the excess arsenic into said substrate.

43. The transistor of claim 41 wherein said barrier layer comprises aluminum or aluminum arsenide.

* * * * *

UNITED STATES PATENT AND TRADEMARK OFFICE
CERTIFICATE OF CORRECTION

PATENT NO. :     5,084,743                        Page 1 of 2
DATED      :     January 28, 1992
INVENTOR(S):     Mishra et al.

It is certified that error appears in the above-identified patent and that said Letters Patent is hereby corrected as shown below:

Column 2, line 58, "62-19897" should be --62-19847--.

Column 7, line 29, "As" should be --As$_4$--.

Column 8, line 12, "With" should be --with--.

Column 8, line 61, "CrOss" should be --cross--.

Column 9, line 11, after "20" insert --.--.

Column 11, line 48 (Claim 27), "region" should be --regions--.

UNITED STATES PATENT AND TRADEMARK OFFICE
CERTIFICATE OF CORRECTION

PATENT NO. : 5,084,743
DATED : January 28, 1992
INVENTOR(S) : Mishra, et al

It is certified that error appears in the above-indentified patent and that said Letters Patent is hereby corrected as shown below:

Column 12, line 22 (claim 33), "27" should be —32—.

Signed and Sealed this

Twelfth Day of October, 1993

BRUCE LEHMAN

Attest:

Attesting Officer    Commissioner of Patents and Trademarks